(12) United States Patent
Itimura et al.

(10) Patent No.: US 6,703,842 B2
(45) Date of Patent: Mar. 9, 2004

(54) METHOD FOR DISCRIMINATING ABNORMAL CURRENT INCLUDING ARC CURRENT IN AC LOAD CIRCUIT AND APPARATUS FOR EXECUTING THE SAME

(75) Inventors: Yasuo Itimura, Kodoma (JP); Akimi Shiokawa, Kadoma (JP); Yoichi Kunimoto, Kadoma (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/058,434

(22) Filed: Jan. 24, 2002

(65) Prior Publication Data

US 2003/0137309 A1 Jul. 24, 2003

(30) Foreign Application Priority Data

Jan. 25, 2001 (JP) ........................................ 2001-017487
Jan. 24, 2002 (JP) ........................................ 2002-015795

(51) Int. Cl.[7] .............................................. H01H 31/02
(52) U.S. Cl. ........................ 324/544; 324/536; 702/58
(58) Field of Search .......................... 324/76.55, 76.39, 324/588, 541, 544, 551, 536; 702/58; 361/42

(56) References Cited

U.S. PATENT DOCUMENTS 5,839,092 A * 11/1998 Erger et al. ................... 702/58
6,400,258 B1 * 6/2002 Parker .................. 340/310.01

* cited by examiner

Primary Examiner—N. Le
Assistant Examiner—Donald M. Lair
(74) Attorney, Agent, or Firm—Koda & Androlia

(57) ABSTRACT

An abnormal current discriminating method including an arc current detecting method and the apparatus for performing the same in which the arc current method includes the steps of: extracting a predetermined transition pattern specified by the combination of fluctuation patterns of peak values of three continuous half waves from the peak value for each half wave detected from an alternating current flowing to the AC load circuit which is sampled in a predetermined cycle and converted into a digital value, counting the number of appearances of the predetermined transition pattern, and comparing the count value with a predetermined threshold. According to which, a series arc which may be caused in a relative small current range by an apparatus cord or the like which has not been detected by an instantaneous breaker and an arc short-circuit phenomenon generated together with an arc through the contact between the cores in a cord and an interior wiring can be detected by executing simple algorithm without error detecting.

17 Claims, 6 Drawing Sheets

METHOD FOR DISCRIMINATING ABNORMAL CURRENT INCLUDING ARC CURRENT IN AC LOAD CIRCUIT AND APPARATUS FOR EXECUTING THE SAME

BACKGROUND OF THE INVENTION

1. Field of the Invention

The present invention relates to an abnormal current discriminating method for detecting an arc generation accident, an overload and a short circuit in an AC load circuit for preventing fires or the like due to such electric accident, and more particularly to a method to be utilized as a protective apparatus for an electric circuit for housing including an extension cord, a cord having a tool and a plug socket.

2. Description of the Related Art

The protection of a cord and a load apparatus through an overcurrent or a short-circuit current has conventionally been carried out by a bimetallic breaker or a breaker using an electromagnetic coil for instantaneous cut-off.

In general, an instantaneous cut-off type breaker is constituted to carry out cut-off when a current which is almost ten times as large as a rated current of the breaker or more flows. In the case in which cores come in contact with each other due to a deterioration in the insulation of a cord so that an arc short circuit is caused, a short-circuit current is not continuous but intermittent different from a load current without the flow of an operating current of an instantaneous breaker. In some cases, therefore, the instantaneous breaker is not operated, resulting in a fire.

In order to eliminate such a drawback, there has been developed a breaker for detecting a current waveform peculiar to an arc. The breaker serves to distinguish and detect a current region which is generated by the contact of the cores of a cord and cannot be detected by the instantaneous breaker from a load current through an electronic circuit. However, a current waveform is also recognized as an arc short-circuit current waveform. In some cases, therefore, a malfunction is caused with a general load current waveform.

As a typical phenomenon in which a fire is caused by a short circuit, the cores are short-circuited so that a short-circuit current flows. At this time, the core is molten by a large current on a short-circuit point so that an arc discharge is generated. The arc discharge generates a very high temperature and scatters a hot molten substance such as a core and a surrounding inflammable substance is ignited to cause a fire.

The arc short circuit caused by the contact and melting of the cores is similarly generated in a load apparatus or an interior wiring in addition to a power cord or extension cord. Moreover, there is also a possibility that a micro current might continuously flow to finally generate an arc short circuit due to deterioration in insulation between plug socket blades.

Moreover, in the case in which one of the cores is cut by some stress and the cut portions come in contact with each other by some force, a current flows and an arc discharge is generated on a cut end if a load is connected. Such an arc generation phenomenon is referred to as a series arc because a current path and a load are connected in series. If such a series arc is generated, a fire is sometimes caused by the molten substance scattered through the arc if a load current is large. In the conventional art, however, a phenomenon generated together with a series arc discharge cannot be detected sufficiently. Therefore, it is greatly desired that an effective breaker should be developed.

SUMMARY OF THE INVENTION

In consideration of such circumstances, the present invention proposes a method of discriminating without detecting a normal load current an arc short-circuit phenomenon generated together with an arc discharge through the contact of cores in a cord and an interior wiring and a current abnormality of an AC load circuit including a series arc caused in an apparatus cord or the like which has not been detected by an instantaneous breaker, and an abnormal current detecting apparatus which utilize the same method.

Accordingly, it is a first object of the present invention to provide an abnormal current discriminating method in an AC load circuit capable of detecting no normal load current and detecting without error abnormal current such as an arc short-circuit current generated together with an arc discharge phenomena through the contact of cores in a cord and an interior wiring and a series arc caused through the contact of the cores in an apparatus cord or the like which has not been detected by an instantaneous breaker.

Furthermore, it is a second object of the present invention to provide a discriminating method for detecting a short-circuit current occurring without arc phenomena and over load current in an AC load circuit.

Moreover, it is a third object of the present invention to provide an abnormal current detecting apparatus of an AC load circuit for executing the present methods according to the present invention.

In order to attain the first object, the present invention provides an arc current discriminating method in an AC load circuit, comprising the steps of sampling an alternating current flowing to the AC load circuit in a predetermined cycle and converting the alternating current into a digital value corresponding to its instantaneous current to detect a peak value for each half wave, extracting a predetermined transition pattern specified by the combination of fluctuation patterns of peak values of three continuous half waves from the peak value for each half wave which is thus detected and counting up the number of appearances thereof in a restricted predetermined period, and comparing the count value with the predetermined threshold to decide the current to be an arc current when the count value exceeds a predetermined threshold.

In such a method, the predetermined transition pattern to be counted for detecting the arc current is specified by extracting four kinds of fluctuation patterns, that is, no fluctuation to an increase, an increase to no fluctuation, no fluctuation to a decrease, and a decrease to no fluctuation in the peak values of the three continuous half waves. When applying a simpler method according to the present invention, the predetermined transition pattern is specified by two kinds of fluctuation patterns, that is, an increase to a decrease and a decrease to an increase in the peak values of the three continuous half waves.

In such a method, moreover, the predetermined transition pattern can be specified by the fluctuation patterns of the peak values of the three continuous half waves of alternating current flowing to the AC load circuit including positive and negative half waves serially appeared in a time arrangement order, however when applying to an alternating load circuit to which other load current as half wave rectified is added to a normal load current, it is desirable that either positive or negative three continuous half waves of the alternating current is used for extracting the fluctuation patterns of the peak values of the three continuous half waves.

While the unrectified waveform of the alternating current may be subjected to sampling, it is desirable that full wave rectification should be carried out before the sampling process in order to enhance the detecting precision in a peak value.

In the discriminating method according to the present invention, moreover, in order to avoid the erroneous detection of a change in a normal load current, the additional step of comparing a time series array of the transition pattern as extracted with a predetermined load fluctuation pattern, and clearing to reset the count value which is counted up when the time series array is coincident with the predetermined load fluctuation pattern is further included.

Furthermore, if the peak value for each half wave of the alternating current sampled and digitally converted is smaller than a predetermined threshold, that is, the peak value is much smaller than that in the detection range of the arc current and is to be disregarded, it is excluded from the component of the transition pattern and the number of appearances of the transition pattern in the predetermined restricted period is counted up by using a peak value for each half wave of other alternating currents to be a decision object, thereby discriminating an arc current.

The peak value for each half wave of the alternating current can be detected as a maximum value of the alternating current converted into a digital value obtained by detecting a zero cross point of an alternating voltage supplied to the AC load circuit and sampling the alternating current plural times at regular intervals for a period from the zero cross point to a next zero cross point.

In another method, moreover, the peak value for each half wave of the alternating current may be specified by detecting a zero cross point of an alternating voltage supplied to the AC load circuit, sampling the alternating current plural times at regular intervals and converting the alternating current into a digital value for a period from the zero cross point to a next zero cross point, and calculating an average value of a maximum value of the alternating current converted into the digital value and an instantaneous value of at least one alternating current sampled adjacent thereto in a section of the zero cross point.

In a further arc current discriminating method, erroneous detection of an arm current and a normal load waveform can also be prevented.

In such a method, a waveform sharpness (Vmax/VD):Vmax/VD=a maximum value (Vmax) of an alternating current converted into a digital value/{a maximum value (Vmax)–a minimum value (Vmin) in an instantaneous value of at least one sampled alternating current adjacent to the maximum value} which exceeds a predetermined threshold is excluded from the peak value specified by sampling the alternating current and converting the alternating current into a digital value at regular intervals, and the number of appearances of the transition pattern in the predetermined restricted period is counted up by using, as objects, only a peak value for each half wave of other alternating currents, thereby discriminating an arc current.

In another method, moreover, when a time interval between a time that a zero cross point of an alternating voltage supplied to an AC load circuit is detected and the alternating current is sampled plural times at regular intervals and is converted into a digital value for a period from a certain zero cross point to a next zero cross point and a maximum value of the sampled alternating current is obtained and the zero cross point of the alternating voltage exceeds a predetermined threshold, that is, a predetermined phase angle, the detected peak value is excluded and the number of appearances of the transition pattern in the predetermined restricted period is counted up by using a peak value for each half wave of other alternating currents, thereby discriminating an arc current. Consequently, erroneous detection can be prevented from being caused together with a specific load waveform.

In the restricted period in which the number of appearances of the transition pattern is to be counted, a starting point is set to be a time that a first transition pattern to be counted appears.

In the present invention, furthermore, the following method is also applied in order to detect an arc current rapidly.

More specifically, in a method, a starting point of a restricted period in which the number of appearances of the transition pattern to be counted is set to be a time that a first transition pattern to be counted appears, and further if the number of appearances of the transition pattern in the restricted period is less than a predetermined threshold, such starting point of the restricted period is sequentially shifted every half wave, thereby counting the number of appearances of the transition pattern.

In a further method, moreover, when a transition pattern is to be decided based on the fluctuation patterns of the three continuous half waves, at least one peak value used in a previous transition pattern is repeatedly used.

Furthermore, in the present invention, an abnormal current discriminating method for preferably applied to detection of arc short-circuit current which is caused in a larger current range than that of a series arc current is also included. And in such method, an absolute value of the instantaneous value of the detected alternating current is integrated in a predetermined restricted period and then an abnormal current is discriminated by the virtual arc energy value thus integrated.

Namely, such a method is characterized in that an alternating current flowing to the AC load circuit is sampled in a predetermined cycle and is converted into a digital value corresponding to an instantaneous current, then a virtual arc energy is calculated by only simple integrating of an absolute value of an instantaneous value of the current converted into the digital value in a predetermined restricted period, and thereafter it is decided that an abnormal current is generated when the virtual arc energy value thus calculated exceeds a predetermined threshold.

In such a method, moreover, a starting point of the predetermined restricted period is set to be a time that the absolute value of the instantaneous current sampled and digitally converted first exceeds the preset threshold for rapidly discriminating.

Furthermore, an abnormal current discriminating method effective for an arc short-circuit and over load current, of which current ranges are larger than that of virtual arc energy calculation method as mentioned above is further proposed as the present invention, and such method is characterized in that an alternating current flowing to the AC load circuit is sampled in a predetermined cycle, and it is decided that an arc short circuit or another short-circuit current is generated immediately after a value obtained by a conversion into a digital value corresponding to an absolute value of an instantaneous current thus sampled exceeds a predetermined value continuously a predetermined number of times.

There are also proposed a method of concurrently carrying out three kinds of abnormal current discriminating method as mentioned above as the present invention, in which three kind of algorithms for carrying out three kinds of method, namely first to third current discriminating method, are executed by way of inputting alternating current into a current-voltage converting circuit for sampling and digitally converting, of which amplification degree is preset as the same value or as different values according to each of three discriminating methods.

According to the method, in one embodiment, at least one current discriminating method selected from the first to the third current discriminating methods is carried out, and in other embodiment, three kinds of current discriminating method are concurrently carried out in a manner that the data processing for the third current discriminating method is started prior to the data processing for the first and second current discriminating method.

A further abnormal current detecting apparatus is still further proposed as the present invention, the apparatus comprises a current-voltage converting circuit for sampling an alternating current flowing to the AC load circuit in a predetermined cycle and converting the alternating current into a digital value; the amplification degree of circuit being set as the same value or a variable value, a zero cross detecting circuit for detecting a zero cross point of an alternating voltage supplied to the AC load circuit; and a data processing section for executing necessary data processing for carrying out first to third current discriminating methods.

According to the apparatus, in one embodiment, at least one current discriminating method selected from the first to the third current discriminating methods is carried out, and in other embodiment, three kinds of current discriminating method are concurrently carried out in a manner that the data processing for the third current discriminating method is started prior to the data processing for the first and second current discriminating method.

These together with other objects and advantages which will become subsequently apparent reside in the details of construction and operation as more fully hereinafter described and claimed, reference being had to the accompanying drawings forming a part hereof.

DETAILED DESCRIPTION OF THE PREFERRED EMBODIMENTS

An embodiment of the present invention will be described below with reference to the drawings.

In the present invention, the generation of failures such as a current abnormality, an over current or a short circuit with an arc discharge in an AC load circuit is detected by detecting a current flowing in a circuit and carrying out a discrimination or the like.

A short-circuit current flowing in a fault circuit ranges widely. Therefore, short-circuit current in the wide range is detected by a combination of the following three kinds of detecting methods.

More specifically, a first method is applied to a comparatively small current such as a series arc in which a fluctuation pattern peculiar to an arc current is discriminated by extracting a fluctuation pattern of each continuous half wave of an alternating current.

In a second method, an instantaneous current value is subjected to sampling at regular intervals as to an arc short circuit of a comparatively small current region, and a virtual arc energy is integrated for a constant period to decide whether or not the integrated value exceeds a predetermined threshold value.

In a third method, it is decided whether or not the instantaneous value obtained by the sampling exceeds a constant number of times a predetermined threshold value when short circuit phenomena in a comparatively large current region is caused or an overload current is generated.

In the first method, the fluctuation pattern peculiar to the arc current is detected. Therefore, a current other than the arc current is not detected. In the second and third methods, however, an abnormal current even current accident such as short circuit or overload without arc discharge can be detected if it exceeds an abnormal.

Figure 1:
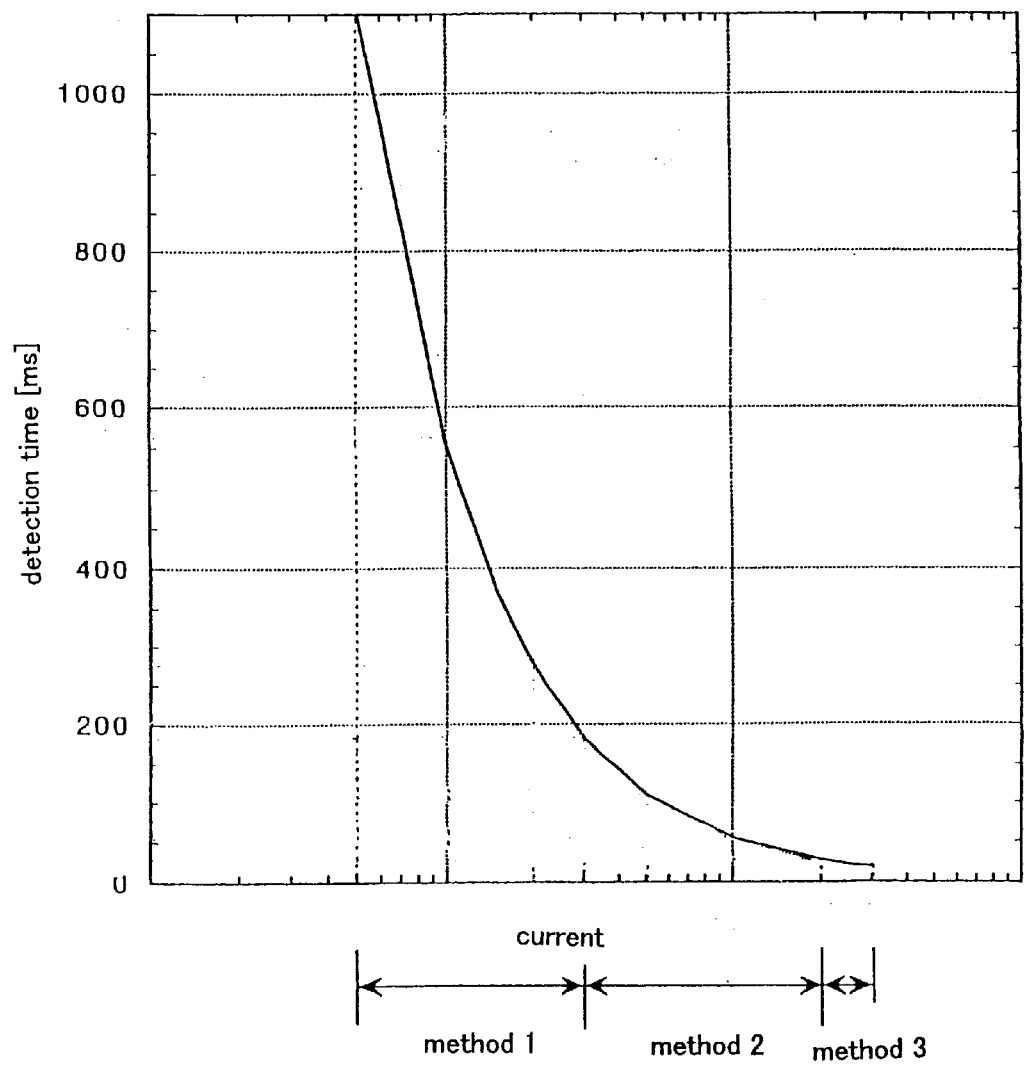
FIG. 1 is a chart showing an example of a target of a detection time to be taken for short-circuit current in a load circuit.

FIG. 1 is a chart showing a target value of a detection time for preventing ignition to an inflammable substance on the periphery of an accident point when an arc accident is caused.

A solid line in FIG. 1 indicates a maximum cut-off time for controlling a virtual arc energy to be a predetermined amount or less in the case in which an arc voltage applied to the accident point is assumed to have a constant value.

Thus, it is hard to implement a cut-off time in a wide range for a short circuit current generated in a load circuit through one discriminating method. In the present invention, therefore, a current abnormality including the arc accident is detected for each current region by carrying out three kinds of methods.

Figure 2:
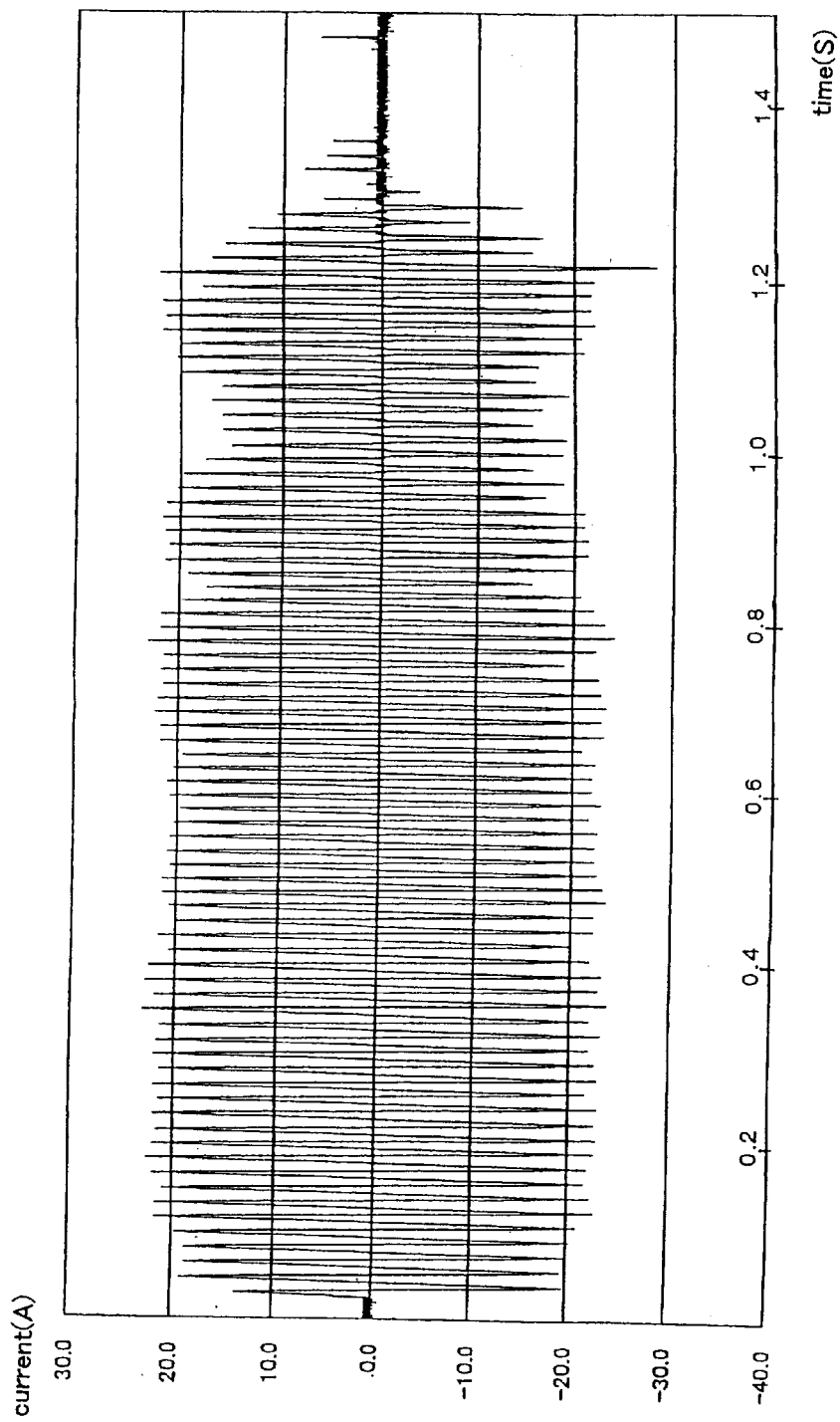
FIG. 2 is a chart showing an example of a waveform of an arc discharge current.

FIG. 2 shows an example of an arc discharge current intended for detection by the first method. FIG. 2 illustrates an AC waveform in which a current value is alternately changed by positively or negatively around an axis of a current of 0 in the center. Taking note of a current peak value for each half wave, it is apparent that a peak value for each half wave fluctuates irregularly. Accordingly, in the present invention, such an irregularity is detected for discriminating.

A current in an AC load circuit is detected by sampling to be a digital value corresponding to an instantaneous current, and the fluctuation patterns of the peak values for continuous half waves are extracted to carry out a data processing. Consequently, it can be decided that the current waveform shown in FIG. 2 is an arc current.

Moreover, fluctuation data extraction may be executed on continuous positive and negative half waves or may be executed on independently each positive half wave and negative half wave of a current.

Figure 3:
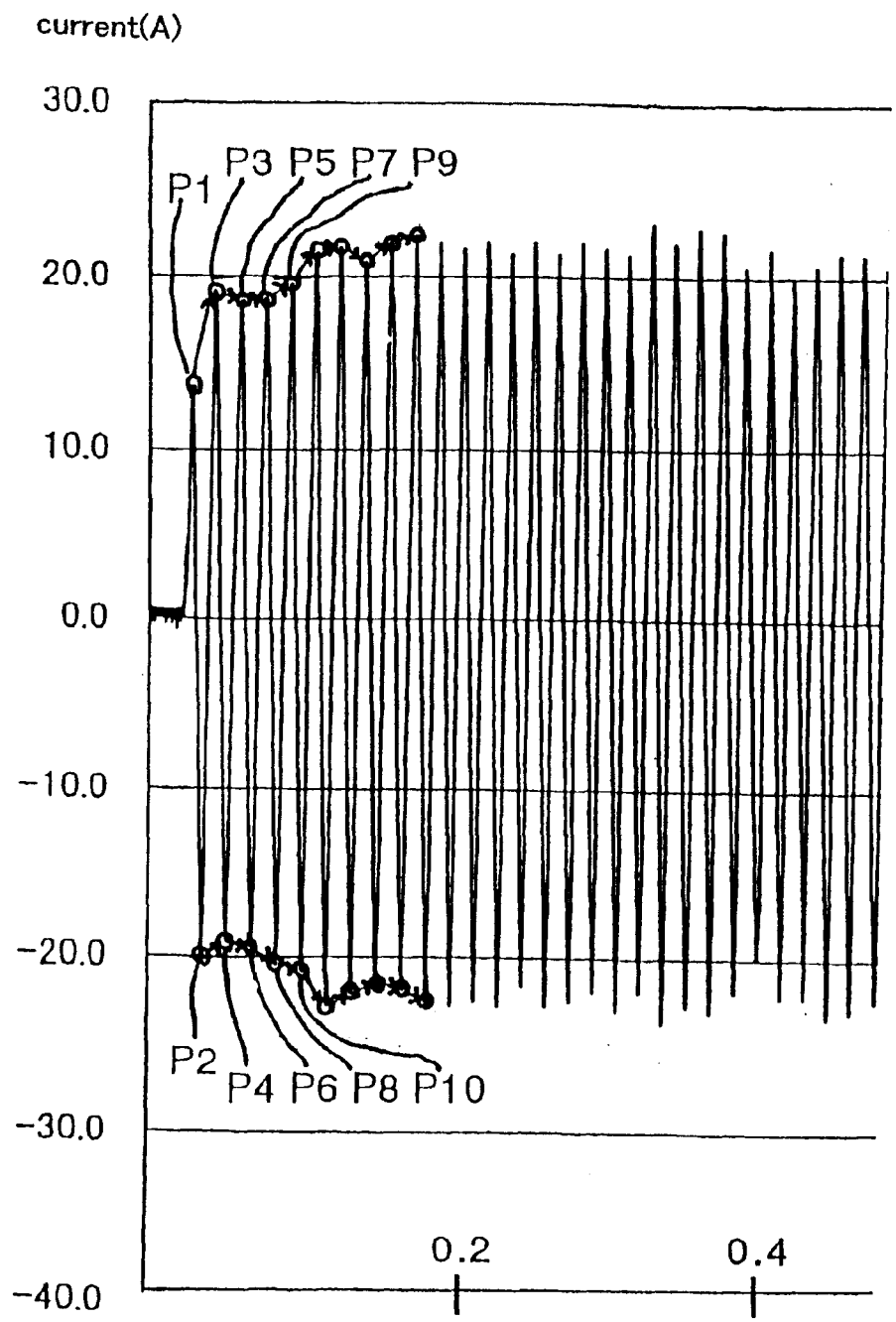
FIG. 3 is a chart for explaining a data processing for extracting a transition pattern form peak values of alternating current.

According to the latter method, when executing only for positive half waves, it should be noted continuous points; P1→P3→P5→P7→P9 . . . , while executing for negative half waves, it should be noted continuous points; P2→P4→P6→P8→P10 . . . as shown in FIG. 3 and a fluctuation from the positive side to the negative side of the peak value like P1→P2 is disregarded, for example.

By executing such method, it may be useful for preventing erroneous detecting of normal load current which may be added as half wave rectified current when a hair drier of low output mode is used with an arc current.

Next, a data processing method for extracting a fluctuation pattern will be described specifically. A fluctuation in two continuous half wave values is classified into at least three fluctuation patterns of "increase", "decrease" and "no fluctuation" and a combination thereof represents a pattern transition of peak values of three continuous half waves. The number of appearances of a specific pattern transition is counted in a certain restricted section and it is decided whether or not an arc discharge is carried out depending that the counted number exceeds a predetermined number of times.

More specifically, an alternating current flowing to an AC load circuit is sampled in a predetermined cycle and is converted into a digital value corresponding to an instantaneous current to detect a peak value for each half wave, and the number of appearances of a predetermined transition pattern defined by the fluctuation patterns of the peak values of the three continuous half waves is counted up in each predetermined restricted section from the peak value for each half wave thus detected. When the count value exceeds a predetermined threshold, the alternating current is decided to be the arc current.

For example, a predetermined sampling cycle is set to 200 μs, a predetermined restricted section is set to 200 ms, and a threshold for the count value is set to 5.

When a peak value for a certain half wave is represented by P1 and a peak value for a next half wave is represented by P2, a fluctuation H can be defined as "H=ABS(P2)/ABS (P1): ABS( ) indicates an absolute value". For example, the case in which the fluctuation H exceeds 1.1 is set to "increase", the case in which the fluctuation H is 0.9 or less is set to "decrease", and the case in which the fluctuation H is more than 0.9 and is equal to or less than 1.1 is set to "no fluctuation".

The pattern transition of the peak values of the three continuous half waves is represented by a combination of two of the three fluctuation patterns. Therefore, it is possible to reliably detect an arc discharge by extracting and counting a specific pattern transition which rarely appears with a normal load current from nine pattern transitions.

In this case, moreover, a data processing is simple, for example, an arithmetical operation or a numerical comparison. Therefore, it is possible to inexpensively detect an arc failure by using a digital control device having a comparatively low speed and poor function.

Moreover, it is also possible to carry out full wave rectification before the alternating current is subjected to a sampling process. Consequently, the peak value can be detected with high precision.

More specifically, the specific pattern transition can be changed into four kinds of patterns of "no fluctuation"→"increase", "increase"→"no fluctuation", "no fluctuation"→"decrease" and "decrease"→"no fluctuation" or two kinds of patterns of "increase"→"decrease" and "decrease"→"increase" as a simple method.

These specific pattern transitions rarely appear with a normal load current. Therefore, the number of appearances is counted within a restricted section so that the arc current can reliably be decided.

Based on a target value of a detection time shown in FIG. 1, a detection target with a maximum current value in a region applying the first method is approximately 200 ms. Therefore, a restricted section for 20 half waves (ten half waves on the positive and negative sides) is desirable as a restricted section for 50 Hz.

Moreover, a peak value for each half wave required for extracting a fluctuation pattern is detected and specified by the following method.

In the first method, a zero cross point of a voltage of an AC load circuit which is to be detected (at which the value of an alternating voltage is changed from a positive to a negative or from a negative to a positive) is detected and an absolute value of the current of the AC load circuit is sampled plural times at regular intervals from a certain zero cross point to a next zero cross point, and a maximum value obtained at that time is set to be a peak value for each half wave.

More specifically, the zero cross point of an alternating voltage supplied to the AC load circuit is detected and an alternating current is sampled plural times at regular intervals and is thus converted into a digital value from the same zero cross point to a next zero cross point. With the maximum value of the alternating current converted into the digital value, a peak value for each half wave of the alternating current is detected.

While an expression of "the sampling of an absolute value" has been used, the absolute value is not always restricted but the restriction is given to simplify the expression of the peak value.

More specifically, the peak value can be defined by only an expression of "a maximum value" if it is an absolute value. In the case in which positive and negative current values are exactly sampled according to signs, a peak value for a negative half wave is expressed as a minimum value, which is complicated. In the following description, the current value will be regarded as the absolute value in ordinary cases.

Usually, it is supposed that a maximum value from a current zero cross point to a next current zero cross point is set to be a peak value by the detection of only a current value. In that case, the current zero cross point is erroneously detected with a noise such as a surge superposed on a current detection signal. As a result, there is a high possibility that the peak value cannot be detected correctly. While it is also supposed that the detection of a voltage zero cross point is influenced by the noise, a higher voltage can be detected from a voltage signal than a current signal detected by a current transformer. Therefore, an S/N ratio can be enhanced and zero cross detection can be carried out with higher reliability so that a current peak value can be detected accurately.

As another method of detecting a peak value, moreover, the zero cross point of the alternating voltage supplied to the AC load circuit is detected and the alternating current is sampled plural times at regular intervals and is thus converted into a digital value in a section from the same zero cross point to a next zero cross point. In the section of the zero cross point, an average value of the maximum value of the alternating current converted into the digital value and the instantaneous value of at least one sampled alternating current adjacent thereto is detected to be a peak value for each half wave of the alternating current.

By the averaging process, the influence of a high frequency noise superposed on a current detection signal is removed and a current peak value can be detected more accurately. Strictly speaking, a different value from a true peak value is detected by detecting and averaging a plurality of sampling values in the vicinity of a maximum value for a normal waveform. For example, assuming that a current having a commercial frequency of 50 Hz or 60 Hz is measured on five points at a sampling interval of approximately 200 µs to obtain an average value, a difference between the average value and the true peak value is 0.6% and the mean value can be practically treated without troubles.

Figure 4:
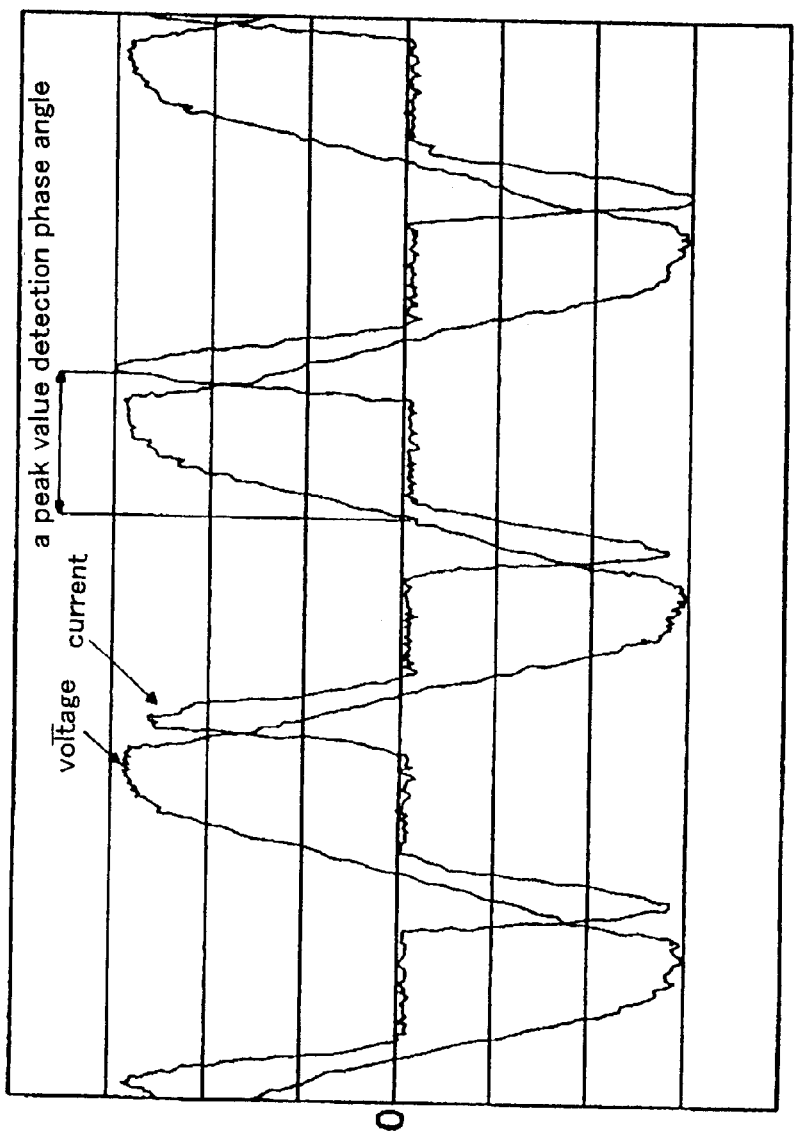
FIG. 4 is a chart showing an example of a load waveform.

FIG. 4 shows an example of a load waveform in a cleaner.

In this case, it is supposed that the current of a motor is phase controlled finely depending on the situations of dust. In some cases, therefore, a current peak value fluctuates greatly. For this reason, there is a high possibility that the pattern transition of the peak value for each half wave might be similar to an arc current waveform, resulting in erroneous detection.

Means for preventing the erroneous detection is proposed.

By the observation of the load current waveform shown in FIG. 4, it is apparent that a current in the vicinity of a current peak value is changed more sharply than a normal sine wave. Taking note of the fact, when a ratio of a fluctuation range (a difference between a maximum value and a minimum value) of a maximum value of a current sampling value between voltage zero crosses and at least one sampling value adjacent thereto to a maximum value (or an average value) (which will be hereinafter referred to as a "peak value vicinity current value change rate") exceeds a predetermined value, a peak value obtained at that time is excluded from a data processing object of the fluctuation pattern. Thus, the erroneous detection can be prevented.

More specifically, the erroneous detection can be prevented and an arc discharge current can be detected by setting the peak value vicinity current value change rate to approximately 5%.

In other words, the zero cross point of the alternating voltage supplied to the AC load circuit is detected and the alternating current is sampled plural times at regular intervals and is thus converted into a digital value in a section from the zero cross point to a next zero cross point. In the case in which a waveform sharpness (Vmax/VD) exceeds a predetermined threshold based on the instantaneous value of the alternating current converted into the digital value and sampled in the section of the zero cross point, the detected peak value is excluded and the number of appearances of a transition pattern in a predetermined restricted section is counted up by using a peak value for each half wave in other alternating currents to be a decision object. Thus, an arc current is discriminated.

The waveform sharpness is expressed in Vmax/VD=a maximum value (Vmax) of an alternating current converted into a digital value/{a maximum value (Vmax)−a minimum value (Vmin) of the instantaneous value of at least one sampled alternating current which is adjacent to the maximum value}.

Next, another means for preventing the erroneous detection will be described.

As shown in FIG. 4, it is apparent that the position of the current peak value and that of the voltage peak value are greatly shifted on a time basis.

Taking note of the foregoing, the zero cross point of a voltage of the AC load circuit is detected and the absolute value of the current of the AC load circuit is sampled plural times at regular intervals in the section from a certain zero cross point to a next zero cross point. When a time interval between a time that a maximum value is obtained at that time and a first zero cross point (which is represented by a peak value detection phase angle in respect of a phase angle in FIG. 4) exceeds a predetermined value, the specified peak value is excluded from the data processing for a fluctuation so that a malfunction can be prevented. More specifically, erroneous detection can be prevented and an arc discharge current can be detected by setting the peak value detection phase angle to approximately 120 degrees.

More specifically, the zero cross point of an alternating voltage supplied to the AC load circuit is detected and an alternating current is sampled plural times at regular intervals and is thus converted into a digital value from a certain zero cross point to a next zero cross point. When a time interval between a time that the maximum value of the alternating current converted into the digital value and sampled and the zero cross point of the alternating voltage exceeds a predetermined threshold in the section of the zero cross point, the detected peak value is excluded and the number of appearances of a transition pattern in a predetermined restricted section is counted up by using a peak value for each half wave of other alternating currents as a decision object. Thus, an arc current is discriminated.

With a small load, moreover, it is observed that a fluctuation in the current value is increased as compared with a great load. Furthermore, it can be supposed that the influence of a detection error is increased. Therefore, there is a high possibility that the current of a normal load might be erroneously detected as an arc current.

In order to prevent the malfunction, if the absolute value of the peak value is less than a certain threshold, the peak value is excluded from the data processing object of the fluctuation pattern.

At this time, the threshold is specifically determined in consideration of the lower limit value of arc current detection to be a target, precision in a current measuring circuit and the like.

More specifically, in the case in which the peak value for each half wave of the alternating current which is sampled and converted digitally is smaller than a predetermined threshold, the peak value is excluded from the component of the transition pattern and the number of appearances of the transition pattern in a predetermined restricted section is counted up by using a peak value for each half wave of other alternating currents as a decision object. Thus, an arc current is discriminated.

Next, description will be given to a starting point of the restricted section. The starting point of the restricted section in which the number of appearances of the transition pattern is counted is set to be a time that a first transition pattern to be counted appears. Consequently, an arc detecting operation time can be shortened.

Usually, it is possible to propose a method of counting up a specific pattern transition for each restricted section from the start of the operation of a detecting device. However, an arc discharge accident is generated at an optional point of time. In most cases, therefore, a phenomenon is captured in the process of the restricted period. For this reason, a detection delay is caused or the detection cannot be carried out if the continuation time of the arc discharge accident is shorter than the restricted section range. In the case in which an arc current value is small and such a delay and non-detection do not cause an ignition accident, there is no trouble. However, an increase in the arc current makes troubles. The starting point of the restricted section is set to be a time that a first specific pattern transition is detected. Thus, the detection delay and the non-detection can be prevented.

Moreover, the starting point of the restricted section is repetitively shifted by a half wave from the starting point of the first restricted section and is thus set. Consequently, although the procedure for the digital processing is slightly complicated, the detection delay and the non-detection can be prevented.

More specifically, when the starting point of the restricted section in which the number of appearances of the transition pattern is to be counted is set to be a time that a first transition pattern to be counted appears, the starting point of the restricted section in which the number of appearances of the transition pattern is to be counted is sequentially shifted every half wave to define a new restricted section and to count the number of appearances of the transition pattern if the number of appearances of the transition pattern in the restricted section is less than a predetermined threshold.

Next, description will be given to means for increasing the speed of the detection according to the method of deciding a pattern transition. When the transition pattern is to be decided based on the fluctuation patterns of the three continuous half waves, a least one peak value to be a decision object in a previous transition pattern is overlapped to be the decision object. One or two peak value(s) for continuous half waves is (are) overlapped to carry out a data processing for deciding the transition pattern. Thus, the speed of the detection can be increased.

For example, two or one of the three peak values to be transition pattern decision objects are(is) overlapped to obtain P1P2P3, P2P3P4 and P3P4P5 (two peak value are overlapped) or P1P2P3, P3P4P5 and P5P6P7 (one peak value is overlapped) if the temporal arrangement of the peak values to be the object for deciding the transition pattern is set to P1→P2→P3→ . . . . Thus, each transition pattern is decided and an appearing specific transition pattern is counted up. Consequently, it is possible to carry out the detection at a higher speed as compared with the case in which the decision is to be performed without an overlap with P1P2P3, P4P5P6 and P7P8P9.

In the case in which the overlapping process is to be carried out, the same value is to be stored by some means in order to be repetitively used for the data processing.

Since the number of storage elements such as a memory is increased depending on the number of overlaps, that of the overlaps is determined by a balance of a detecting speed to be required and the number of storage elements to be used (generally if the number of the storage elements is decreased, a cost can be reduced).

In the case in which any of a plurality of loads is turned on or off in a state they are connected, a fluctuation of "stable→increase→stable→decrease→stable" or "stable→decrease→stable→increase→stable" is generated as a whole load current. When the fluctuation is generated from a shorter time than a restricted period, erroneous detection might be carried out.

When the specific pattern transitions are arranged in order of an appearance and the arrangement is coincident with a predetermined specific arrangement, the count-up of the specific pattern transition is reset to prevent the erroneous detection.

Even if the number of appearances of a transition pattern defined by a fluctuation pattern for each half wave of an alternating current is more than a predetermined threshold in a predetermined restricted section, the number of appearances counted up is cleared and reset when the arrangement of the transition pattern in time series is coincident with a predetermined load fluctuation pattern, and the number of appearances of the transition pattern in the predetermined restricted section is counted up to discriminate an arc current by using a peak value for each half wave of other alternating currents to be a decision object.

Description will be given to the case in which there are four kinds of specific pattern transitions of "no fluctuation→increase (transition A)", "increase→no fluctuation→(transition B)", "no fluctuation→decrease (transition C)" and "decrease→no fluctuation (transition D)", for example.

Figure 5:
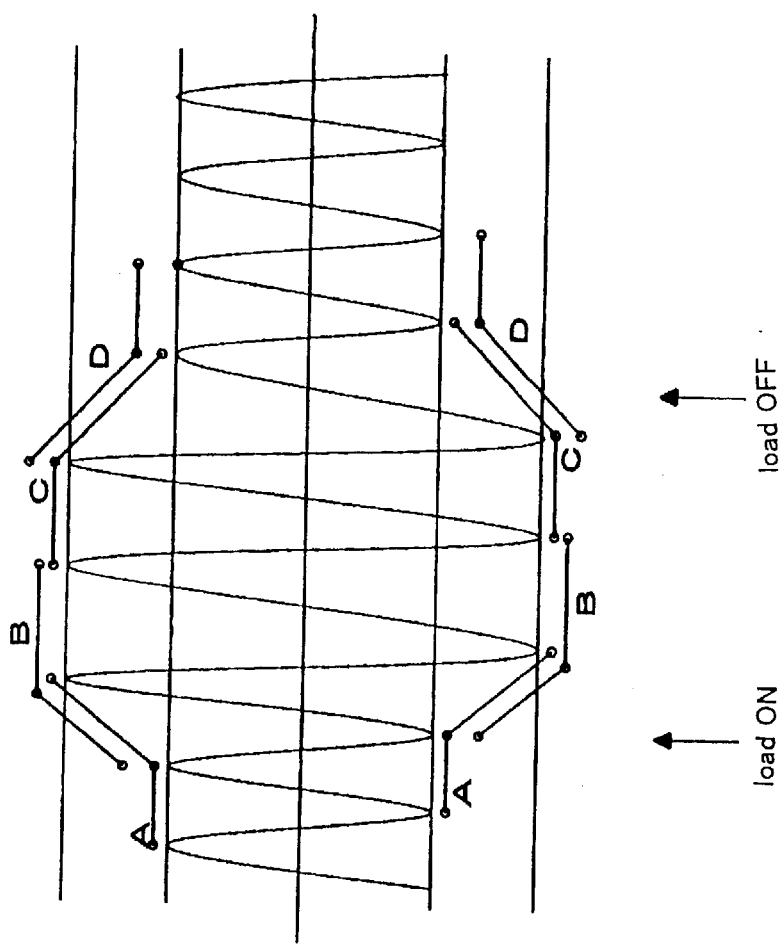
FIG. 5 is a chart showing the situation of appearance of a fluctuation pattern of current in accordance with on and off operation of a load.

In the case in which the whole load current generates a fluctuation of "stable→increase→stable→decrease→stable", a regular transition of "AABBCC . . . " is obtained if the specific pattern transitions discriminated independently on the positive and negative sides are arranged in order of the appearance on the positive and negative sides as shown in FIG. 5.

According to observation, such a transition is rarely generated in an arc current waveform. Therefore, when such regularly arranged pattern appears, then it is considered as an appearance of an normal load current, thus the count value counted up for such transition pattern is reset, thereby preventing the erroneous detection.

Also in the case in which the whole load current generates a fluctuation of "stable→decrease→stable→increase→stable" it is preferable that the count-up number should be reset when a pattern of "CCBBAA. . . " appears. More specifically, if the number of transitions to be a reset object is approximately five, the erroneous detection can be prevented sufficiently. It is also possible to suppose a load fluctuation in a pattern having another regularity other than such a load fluctuation. In that case, it is preferable that a transition to be a reset object should be added if necessary.

Next, a second method will be described.

As shown in FIG. 1, the second method is applied for discriminating an abnormal current of which current range s approximately 30 A to 200 A, for example. A wiring breaker for branch which is incorporated in a distribution board for a house or the like usually has a 20 A rating and has the function of detecting and cutting off the accident current in this area by bimetal. However, it has a longer operation time as compared with the target value of the detection time in FIG. 1 and cannot prevent an accident from being caused by an arc current.

A current in an AC load circuit is sampled and detected to be a digital value corresponding to an instantaneous current, and each sampling value is integrated as a value corresponding to the absolute value of the current in a certain restricted section. Consequently, a value corresponding to a virtual arc energy is calculated and it is regarded that an arc energy to be detected is reached when a predetermined value is exceeded. Consequently, it is possible to provide a failure detecting method having a sufficient function for a practical object of the arc accident detection by a simpler method than the detection of an original arc energy itself (which is obtained by integrating, with a time, a product of the instantaneous value of the accident current and the arc voltage of a generated arc).

A generated arc energy Ea of "Ea=∫i. va. dt, t is a time" on an accident point is obtained, wherein i represents the instantaneous value of an accident current and va indicates the instantaneous value of an arc voltage of a generated arc. va can also be regarded as a constant value Va almost irrespective of a time based on the observation. Therefore, "Ea=Va∫i. dt" can be obtained by transformation.

More specifically, the arc energy Ea is proportional to a time integration of the instantaneous value of the accident current i. The time integral value of i is approximately represented by an integral value of each sampling value in the case in which the instantaneous value of the accident current is sampled at a proper interval. Although the integral value is not an actual arc energy, it has a value which is almost proportional to a virtual arc energy when an arc voltage is assumed to be constant. Therefore, if it is detected that the integral value exceeds a predetermined threshold in a restricted section, the target value of the detection time shown in FIG. 1 can be achieved. Since the restricted section is required to be a maximum of the detection time in the second method, it is approximately 200 ms.

In other words, in the arc current discriminating method, an alternating current flowing to an AC load circuit is sampled in a predetermined cycle and is converted into a digital value corresponding to an instantaneous current, and an absolute value of the instantaneous value of the current converted into the digital value is integrated within a predetermined restricted section, thereby calculating a virtual arc energy. When the virtual arc energy value thus calculated exceeds a predetermined threshold, it is decided that an abnormal current is generated.

By setting the starting point of a predetermined restricted section to be a time that the absolute value of the instantaneous current which is sampled and digitally converted first exceeds a preset threshold, moreover, a detection time can also be shortened for the generation of failures at an optional point of time.

While a method of integrating an instantaneous value for each restricted section from the start of the operation of a detecting device is usually supposed, an arc discharge accident is generated at an optional point of time in that case. In most cases, therefore, a phenomenon is taken over the restricted section and a detection delay or no detection is sometimes caused. By setting the starting point of the restricted section to be a time that a sampling value exceeds a preset threshold, the detection delay and no detection can be prevented.

Next, a third method will be described below. As shown in FIG. 1, the third method is intended for detecting an area of approximately 200 A to 300 A, for example, to be an accident current value. When a value obtained by sampling and detecting a current in the AC load circuit to be a digital value corresponding to the instantaneous current exceeds a predetermined value continuously a predetermined number of times, it is immediately decided that an arc short circuit or another short-circuit accident is caused. Consequently, it is possible to quickly detect a large current arc and a short-circuit accident. Moreover, since a predetermined number of times is continuously detected, erroneous detection can be prevented from being caused by a sharp surge noise superposed on a current waveform.

More specifically, when the alternating current flowing to the AC load circuit is sampled in a predetermined cycle and a value converted into a digital value corresponding to an absolute value of the sampled instantaneous current exceeds a predetermined value continuously a predetermined number of times, it is immediately decided that an arc short circuit or another short-circuit current is generated.

Next, description will be given to method for integrating the first to third methods, which is effective as a functional product for actual use.

In this method, a current in the AC load circuit is input to a separate analog-digital converter (hereinafter referred to as an "A/D converter") through a plurality of current-voltage converting circuits having different outputs and a digital value thus obtained is subjected to a data processing in various procedures. Consequently, an accident current can be detected with high precision in a wide current region shown in FIG. 1.

Usually, the A/D converter has a resolution of approximately 10 bits at most. If the current region shown in FIG. 1 is to be detected through one A/D converter, a digital value having a minimum value of 5 A is 18 by causing 300 A to correspond to a maximum value 1023 of a 10-bit digital value. In such a region, it is necessary to decide a fluctuation in a current value of approximately 10% in order to detect an arc current by the first method. A difference of approximately 2 (10% of 18) is obtained with a digital value and it may be not easy to detect with high precision when considering a quantization error.

As its countermeasure, it is desirable that a current signal is input to two A/D converters through two amplifying circuits having different degrees of amplification to cause one of the A/D converters to output a digital value of 1023 to a 30 A input and the other A/D converter to output the digital value of 1023 to a 300 A input.

If the data processing for the first method is executed for the former and the data processing for the second and third methods are executed for the latter, thus an accident current can be detected with high precision in a wide current region.

For each of the first to third methods, a simple data processing is carried out. Therefore, it is sufficiently possible to concurrently executing the data processing by way of three methods over each half wave by means of an inexpensive microcomputer. As another method, furthermore, a current signal may be also detected to be a signal having two different conversion ratios of a current transformer and a shunt resistor.

As described above, moreover, when the data processing for the first to third methods are executed over each half wave, if the apparatus is set in advance such that the data processing for the third method which requires most early execute is started prior other data processing for the first and the second method ,then rapid detection for a large current can be easily realized.

In an abnormal current discriminating method, when executing data processing over the instantaneous value of a current which is obtained by inputting an alternating current flowing to an AC load circuit to a plurality of current-voltage converting circuits and sampling and digitally converting the alternating current in a predetermined cycle to carry out three kinds of discriminating methods including the first, the second and the third current discriminating methods, the current-voltage converting circuits are set in advance such that of which amplification degree is varied depending on the three kinds of current discriminating methods.

In this embodiment, concurrent execution for three kinds of current discriminating methods can be carried out in a manner that the data processing for the third method over the instantaneous value of a current which is obtained by sampling and digitally converting the alternating current in a predetermined cycle is started prior to the data processing for the first and the second methods.

Now the description is given to two amplifier with different amplification degrees, however single amplifier may be of course also employed when not required higher accuracy.

Figure 6:
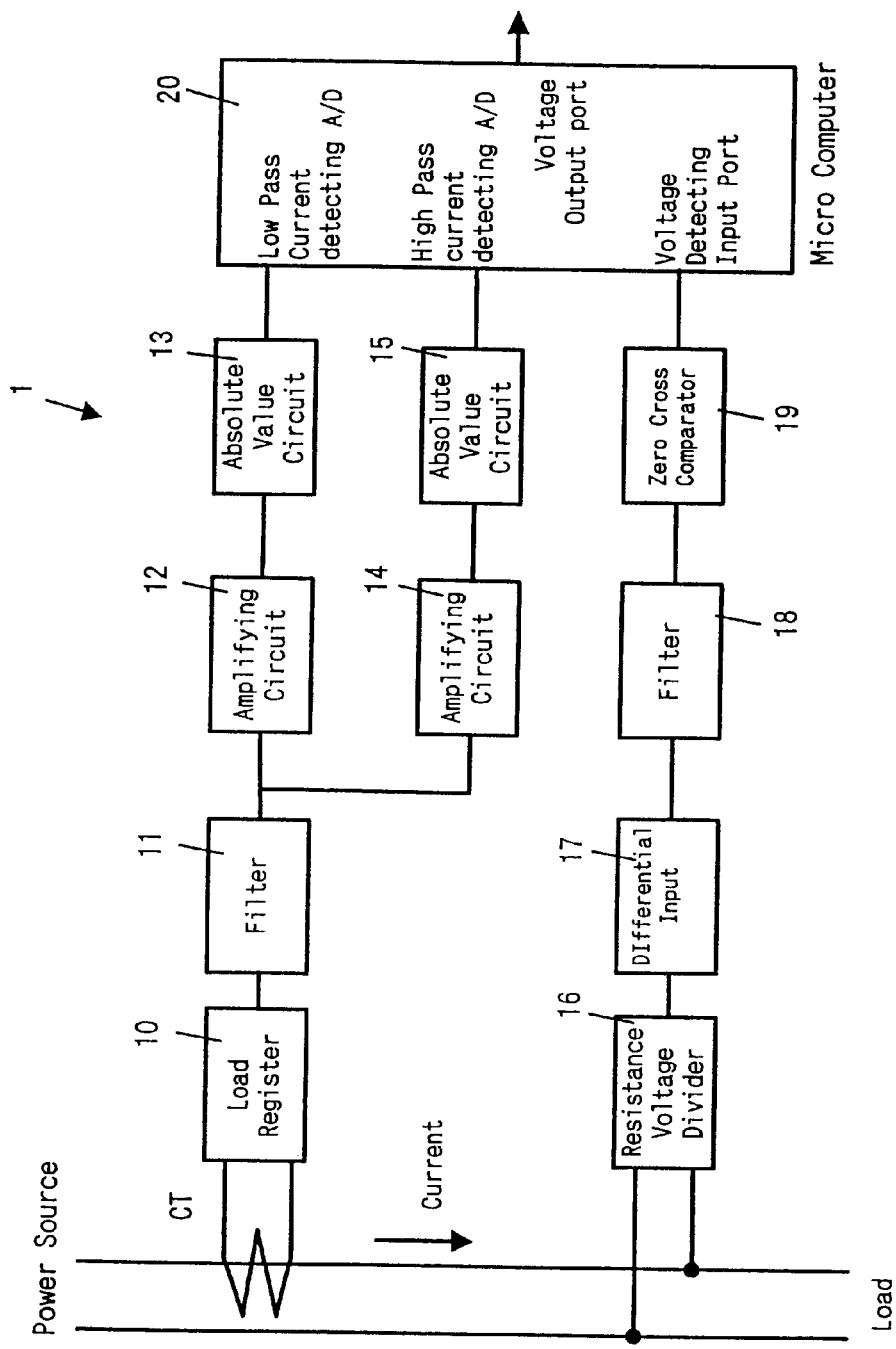
FIG. 6 is a block diagram showing an example of the structure of an abnormal current detecting apparatus according to the present invention.

FIG. 6 shows an example of basic structure of an abnormal current detecting apparatus according to the present invention.

The apparatus comprises various functioning sections as follows, wherein the current of the AC load circuit is detected by CT and is input to two amplifying circuits 12 and 14 through a load resistor 10 and a filter 11. The amplifying circuits 12 and 14 have different degrees of amplification and each outputs maximum digital values at 30 A, 300 A respectively when the current is input to low-pass and high-pass current detecting A/Ds of a microcomputer 20.

Absolute value circuits 13 and 15 provided as the subsequent stages to the amplifying circuits 12 and 14 serve to full wave rectify an alternating current waveform in order to effectively use the resolution of the A/D converter.

Furthermore, the voltage of the AC load circuit is input to a zero cross comparator 19 through a resistance voltage divider 16, a differential input 17 and a filter 18, and an output repeating 0V and 5V for each zero cross is sent to the voltage detecting input port of the microcomputer 20 respectively.

The microcomputer 20 executes a predetermined data processing over the two kinds of current digital vales and a voltage zero cross signal in accordance with a predetermined program including plural algorithms prepared in advance for three kinds of methods, and outputs immediately an accident detection signal from a voltage output port when accident detection is decided, namely discriminate abnormal current as above-mentioned.

The abnormal current detecting apparatus of the AC load circuit as shown in the FIG. 6 comprises a current-voltage converting circuit for sampling an alternating current flowing to the AC load circuit in a predetermined cycle and converting the alternating current into a digital value, a zero cross detecting circuit for detecting a zero cross point of an alternating voltage supplied to the AC load circuit, and a data processing section for inputting a digital value of the alternating current sent from the current-voltage converting circuit and a zero cross detection signal transmitted from the zero cross detecting circuit, and executing an algorithm required for carrying out the first current discriminating method, the second current discriminating method and the third current discriminating method.

The amplification of the current-voltage converting circuit into which instantaneous current flows is set a high degree for small current and set small degree for large current for executing latter data processing, and such setting of amplification is adjusted by a data processing section for executing data processing for three kind of current discriminating methods above-mentioned.

Now the embodiment is explained for two amplifier with different amplification degrees in the above, however single amplifier may be also employed when not required higher accuracy.

Moreover, in this embodiment, the first, the second and the third current discriminating methods are concurrently carried out by executing the data processing over instantaneous current value sampled in a predetermined cycle and converted into a digital value in a manner that the data processing for the third method is started prior to the data processing for the first and the second methods.

However, the apparatus can be of course arranged such that the apparatus carries out at least one current discriminating method selected from three kinds of discriminating methods for purpose of user use, thus in such arrangement, data processing program including corresponding algorithm for carrying at least one method is stored in the data processing section, therefore, according to the present invention, at least one method selected from three kinds of current discriminating methods can be easily carried out in accordance with the purpose of product use by only changing and/or adding data processing program to be stored therein.

Moreover, the present invention is applied to more wide use, for example, one of which can be applied to circuit breaker or the other of which can be applied to a plug socket for supplying a commercial power.

In application to a circuit breaker, a corresponding main part of the abnormal current detecting apparatus as shown at 1 in FIG. 6 may be incorporated into a circuit breaker together with a tripping device, each of which is known, thus according to such circuit breaker, it may have a high function of cutting off an arc accident including a series arc accident.

More specifically, in the circuit breaker of the AC load circuit, a main part of the abnormal current detecting apparatus of the AC load circuit is incorporated in a circuit breaker body for cutting off an alternating power exceeding a rating which is sent to the AC load circuit. Such circuit breaker has the function of cutting off the alternating power when the generation of an arc current and an abnormal current is discriminated by the first to third methods in addition to the function of cutting off the alternating power when an alternating current exceeding a rated value flows to the AC load circuit.

Moreover, such plug socket that the corresponding main part of the abnormal current detecting apparatus same applied to circuit breaker as mentioned is incorporated together with a relay device may have also the same function of cutting off abnormal current.

Whereas, in application to a plug socket, a corresponding main part of the abnormal current detecting apparatus as shown at 1 in FIG. 6 may be also incorporated into a known plug socket, thereby enabling an abnormal current such as arc current, short circuit current and overload current to be cut off by carrying at least one current discriminating method selected form three kinds of current discriminating methods above-mentioned.

Although the invention has been particularly shown and described with reference to preferred embodiments thereof, it will be understood by those skilled in the art that the foregoing and other changes in form and details can be made therein without departing from the spirit and scope of the invention.

What is claimed is:

1. An abnormal current discriminating method in an AC load circuit, comprising the steps of:

sampling an alternating current flowing to the AC load circuit in a predetermined cycle and converting the alternating current into a digital value corresponding to its instantaneous current to detect a peak value for each half wave;

extracting a predetermined transition pattern specified byte combination of fluctuation patterns of peak values of three continuous half waves from the peak value for each half wave thus detected and counting the number of appearances thereof in a restricted predetermined period; and comparing the count value with a predetermined threshold and deciding the current to be an arc current when the count value exceeds the threshold; and wherein the predetermined transition pattern is specified by four kinds of fluctuation patterns, that is, no fluctuation to an increase, an increase to no fluctuation, no fluctuation to a decrease, and a decrease to no fluctuation in the peak values of the three continuous half waves.

2. The abnormal current discriminating method in an AC load circuit according to claim 1, wherein the method further comprises the steps of comparing a time stiles array of the transition pattern thus extracted with a predetermined load fluctuation pattern, and clearing to reset the count value which is counted up when the time series array is coincident with the predetermined load fluctuation pattern.

3. The abnormal current discriminating method in an AC load circuit according to claim 1, wherein in the case that the peak value for each half wave of the alternating current sampled and digitally converted is smaller than a predetermined threshold, such peak value is excluded, and the number of appearances of the transition pattern for other peak values of alternating currents is counted up, thereby discriminating an arc current.

4. The abnormal current discriminating method in an AC load circuit according to claim 1, wherein the peak value for each half wave of the alternating current is specified as the maximum value by executing following data processing of: detecting a zero cross point of an alternating voltage supplied to the AC load circuit, sampling the alternating current plural times at regular intervals for a period from the zero cross point to a next zero cross point and converting the alternating current into a digital value, and further extracting the maximum value among the converted digital values of the alternating current.

5. The abnormal current discriminating method in an AC load circuit according to claim 4, wherein when the alternating current sampled and converted into a digital value for a period of the zero cross point has a defined waveform sharpness (Vmax/VD): Vmax/VD=a maximum value (Vmax) of an alternating current converted into a digital value/{a maximum value (Vmax)−a minimum value (Vmin) in an instantaneous value of at least one sampled alternating current adjacent to the maximum value} which exceeds a predetermined threshold, such specified peak value for the period of the zero cross point is excluded and the number of appearances of the transition pattern for other peak value for each half wave of other alternating currents is counted up, thereby discriminating an arc current.

6. The abnormal current discriminating method in an AC load circuit according to claim 4, wherein when a time interval between a time that the maximum value of the alternating current sampled and converted into a digital value and the zero cross point of the alternating voltage exceeds a predetermined threshold for the period of the zero cross point, such peak value is excluded and the number of appearances of the transition pattern for a peak value for each half wave of other alternating currents is counted up in the restricted predetermined period, thereby discriminating an arc current.

7. The abnormal current discriminating method in an AC load circuit according to claim 1, wherein the peak value for each half wave of the alternating current is specified as the maximum value by executing following data processing of: detecting a zero cross point of an alternating voltage supplied to the AC load circuit, sampling the alternating current plural times at regular intervals for a period from the zero cross point to a next zero cross point and converting the alternating current into a digital value, and calculating a mean value with a maximum value of the alternating current converted into the digital value and an instantaneous value of at least one sampled alternating current adjacent thereto.

8. The abnormal current discriminating method in an AC load circuit according to claim 1, wherein a starting point of an interval in which the number of appearances of the transition pattern is to be counted is set to be a time that a first transition pattern to be counted appears.

9. The abnormal current discriminating method in an AC load circuit according to claim 1, wherein a starting point of a restricted interval in which the number of appearances of the transition pattern is to be counted is set to be a time that a first transition pattern to be counted appears, and furthermore, if the number of appearances of the transition pattern in the restricted interval is less than a predetermined threshold, the starting point of the interval in which the number of appearances of the transition pattern is to be counted is sequentially shifted every half wave, thereby counting the number of appearances of the transition pattern.

10. The abnormal current discriminating method in an AC load circuit according to claim 1, wherein when a transition pattern is to be decided based on the fluctuation patterns of the three continuous half waves, at least one peak value to be a decision object in a previous transition pattern is duplicated to be the decision object.

11. The abnormal current discriminating method in an AC load circuit according to claim 1, wherein the fluctuation patterns are detected from either positive or negative three continuous half waves of the alternating current flowing to the AC load circuit.

12. The abnormal current discriminating method in an AC load circuit according to claim 1, wherein the alternating current flowing to the AC load circuit is full wave rectified prior to the sampling step.

13. The abnormal current discriminating method in an AC load circuit according to claim 1, wherein a starting point of the predetermined restricted period is set to be a time that the absolute value of the instantaneous current sampled and digitally converted first exceeds the preset threshold.

14. An abnormal current discriminating method in an AC load circuit in which at least one abnormal discriminating method selected from first to third abnormal current discriminating method is carried out by sampling and converting into a digital value through a current-voltage converting circuit an alternating current flowing to the AC load circuit in a predetermined cycle and then executing predetermined data processing, wherein the amplification degree of the current—voltage converting circuit is preset as the same value or as different values for carrying out the first to third method, and wherein the first current discriminating method comprises the steps of:

sampling an alternating current flowing to the AC load circuit in a predetermined cycle and converting the alternating current into a digital value corresponding to its instantaneous current to detect a peak value for each half wave;

extracting a predetermined transition pattern specified by fluctuation patterns of peak values of three continuous half waves from the peak value for each half wave thus detected and counting the number of appearances thereof in a restricted predetermined period; and comparing the count value with a previously specified threshold and deciding the current to be an arc current when the count value exceeds the threshold, and wherein the second current discriminating method comprises the steps of:

sampling an alternating current flowing to the AC load circuit in a predetermined cycle and converting the alternating current into a digital value corresponding to an instantaneous current;

calculating a virtual arc energy by integrating an absolute value of an instantaneous value of the current converted into the digital value in a predetermined restricted period; and deciding that an abnormal current is generated when a virtual arc energy value thus calculated exceeds a predetermined threshold, and further, wherein the third current discriminating method comprises the steps of:

sampling an alternating current flowing to the AC load circuit in a predetermined cycle; and deciding that an arc short circuit or another short-circuit current is generated immediately after a value converted into a digital value corresponding to an absolute value of an instantaneous current thus sampled exceeds a predetermined value continuously a predetermined number of times.

15. An abnormal current discriminating method in an AC load circuit in which at least one abnormal discriminating method selected from first to third abnormal current discriminating method is carried out by sampling and converting into a digital value through a current-voltage converting circuit an alternating current flowing to the AC load circuit in a predetermined cycle and then executing predetermined data processing, wherein the amplification degree of the current—voltage converting circuit is preset as the same value or as different values for carrying out the first to third method, and wherein the first current discriminating method comprises the steps of:

sampling an alternating current flowing to the AC load circuit in a predetermined cycle and converting the alternating current into a digital value corresponding to its instantaneous current to detect a peak value for each half wave;

extracting a predetermined transition pattern specified by fluctuation patterns of peak values of three continuous half waves from the peak value for each half wave thus detected and counting the number of appearances thereof in a restricted predetermined period; and comparing the count value with a previously specified threshold and deciding the current to be an arc current when the count value exceeds the threshold, and wherein the second current discriminating method comprises the steps of:

sampling an alternating current flowing to the AC load circuit in a predetermined cycle and convening the alternating current into a digital value corresponding to an instantaneous current;

calculating a virtual arc energy by integrating an absolute value of an instantaneous value of the current converted into the digital value in a predetermined restricted period; and deciding that an abnormal current is generated when a virtual arc energy value thus calculated exceeds a predetermined threshold, and further, wherein the third current discriminating method comprises the steps of:

sampling an alternating current flowing to the AC load circuit in a predetermined cycle; and deciding that an arc short circuit or another short-circuit current is generated immediately after a value converted into a digital value corresponding to an absolute value of an instantaneous current thus sampled exceeds a predetermined value continuously a predetermined number of times, and further wherein the first to the third current discriminating methods are carried out in a manner that the data processing for the third method is started prior to the data processing for the first and the second methods with respect to the alternating current flowing to the AC load circuit, thereby concurrently carrying out the first to third methods.

16. An abnormal current detecting apparatus of an AC load circuit comprising:

a current-voltage converting circuit for sampling an alternating current flowing to the AC load circuit in a predetermined cycle and converting the alternating current into a digital value; the amplification degree of circuit being set as the same value or a variable value, a zero cross detecting circuit for detecting a zero cross point of an alternating voltage supplied to the AC load circuit; and a data processing section for executing necessary data processing for carrying out at least one current discriminating method selected from first to third current discriminating methods, wherein the first current discriminating method is carried out by following data processing of:

sampling an alternating current flowing to the AC load circuit in a predetermined cycle and converting the alternating current into a digital value corresponding to its instantaneous current to detect a peak value for each half wave;

extracting a predetermined transition pattern specified by fluctuation patterns of peak values of three continuous half waves from the peak value for each half wave thus detected and counting the number of appearances thereof in a predetermined restricted period; and comparing the count value with a predetermined threshold and deciding the current to be an arc current when the count value exceeds the threshold, and wherein the second current discriminating method is carried out by following data processing of:

sampling an alternating current flowing to the AC load circuit in a predetermined cycle and converting the alternating current into a digital value corresponding to an instantaneous current;

calculating a virtual arc energy by integrating an absolute value of an instantaneous value of the current converted into the digital value in a predetermined restricted period; and deciding that an abnormal current is generated when a virtual arc energy value thus calculated exceeds a predetermined threshold, and further, wherein, the third current discriminating method is carried out by following data processing of:

sampling an alternating current flowing to the AC load circuit in a predetermined cycle; and deciding that an arc short circuit or another short-circuit current is generated immediately after a value converted into a digital value corresponding to an absolute value of an instantaneous current thus sampled exceeds a predetermined value continuously a predetermined number of times.

17. An abnormal current detecting apparatus of an AC load circuit comprising:

a current-voltage converting circuit for sampling an alternating current flowing to the AC load circuit in a predetermined cycle and converting the alternating current into a digital value; the amplification degree of circuit being set as the same value or a variable value, a zero cross detecting circuit for detecting a zero cross point of an alternating voltage supplied to the AC load circuit; and a data processing section for executing necessary data processing for carrying out first to third current discriminating methods, wherein the first current discriminating method is carried out by following data processing of:

sampling an alternating current flowing to the AC load circuit in a predetermined cycle and converting the alternating current into a digital value corresponding to its instantaneous current to detect a peak value for each half wave;

extracting a predetermined transition pattern specified by fluctuation patterns of peak values of three continuous half waves from the peak value for each half wave thus detected and counting the number of appearances thereof in a predetermined restricted period; and comparing the count value with a predetermined threshold and deciding the current to be an arc current when the count value exceeds the threshold, and wherein the second current discriminating method is carried out by following data processing of:

sampling an alternating current flowing to the AC load circuit in a predetermined cycle and converting the alternating current into a digital value corresponding to an instantaneous current;

calculating a virtual arc energy by integrating an absolute value of an instantaneous value of the current converted into the digital value in a predetermined restricted period; and deciding that an abnormal current is generated when a virtual arc energy value thus calculated exceeds a predetermined threshold, and further, wherein the third current discriminating method is carried out by following data processing of:

sampling an alternating current flowing to the AC load circuit in a predetermined cycle; and deciding that an arc short circuit or another short-circuit current is generated immediately after a value converted into a digital value corresponding to an absolute value of an instantaneous current thus sampled exceeds a predetermined value continuously a predetermined number of times, and further wherein the first to the third current discriminating methods are carried out in a manner that the data processing for the third current method is started prior to the data processing for the first and the second methods with respect to the alternating current flowing to the AC load circuit thereby concurrently carrying out the first to third current method.

* * * * *